(12) United States Patent
Oukassi et al.

(10) Patent No.: US 9,373,864 B2
(45) Date of Patent: Jun. 21, 2016

(54) LITHIUM MICROBATTERY FABRICATION METHOD

(71) Applicant: COMMISSARIAT À L'ENERGIE ATOMIQUE ET AUX ENERGIES ALTERNATIVES, Paris (FR)

(72) Inventors: Sami Oukassi, Saint-Eève (FR); Arnaud Bazin, Fontaine (FR)

(73) Assignee: COMMISSARIAT A L'ENERGIE ATOMIQUE ET AUX ENERGIES ALTERNATIVE, Paris (FR)

( * ) Notice: Subject to any disclaimer, the term of this patent is extended or adjusted under 35 U.S.C. 154(b) by 125 days.

(21) Appl. No.: 14/445,874

(22) Filed: Jul. 29, 2014

(65) Prior Publication Data

US 2015/0027979 A1    Jan. 29, 2015

(30) Foreign Application Priority Data

Jul. 29, 2013 (FR) .................................... 13 01817

(51) Int. Cl.
| | |
|---|---|
| *H01M 10/04* | (2006.01) |
| *H01M 4/38* | (2006.01) |
| *H01M 4/04* | (2006.01) |
| *H01M 4/1395* | (2010.01) |
| *H01M 6/04* | (2006.01) |

(Continued)

(52) U.S. Cl.
CPC ............ *H01M 10/04* (2013.01); *H01M 4/0407* (2013.01); *H01M 4/0492* (2013.01); *H01M 4/1395* (2013.01); *H01M 4/382* (2013.01); *H01M 6/045* (2013.01); *H01M 6/186* (2013.01); *H01M 6/187* (2013.01); *H01M 6/40* (2013.01); *H01M 10/052* (2013.01); *H01M 10/0562* (2013.01); *H01M 10/0585* (2013.01); *H01M 10/38* (2013.01); *B81C 1/00396* (2013.01); *B81C 1/00412* (2013.01); *C09K 13/04* (2013.01); *C23F 1/02* (2013.01); *C23F 4/00* (2013.01); *G03F 7/094* (2013.01); *H01M 4/045* (2013.01); *H01M 4/0421* (2013.01); *H01M 4/0426* (2013.01); *H01M 2300/0002* (2013.01); *Y02E 60/122* (2013.01)

(58) Field of Classification Search
None
See application file for complete search history.

(56) References Cited

U.S. PATENT DOCUMENTS

2007/0067984 A1    3/2007    Gaillard et al.
2008/0311477 A1    12/2008    Salot et al.

(Continued)

FOREIGN PATENT DOCUMENTS

| FR | 2 862 437 A1 | 5/2005 |
|---|---|---|
| FR | 2 873 854 A1 | 2/2006 |
| FR | 2 943 181 A1 | 9/2010 |
| WO | WO 2012/173874 A2 | 12/2012 |

*Primary Examiner* — Anita Alanko
(74) *Attorney, Agent, or Firm* — Oliff PLC

(57) ABSTRACT

The method for fabricating a lithium microbattery is performed from a stack of layers successively including: a first layer made from a first material, a second layer made from a second material, a solid electrolyte layer and a first electrode. The method further includes etching to form a first pattern made from the first material and a second pattern made from the second material, the second pattern defining a covered area and an uncovered area of the electrolyte layer. The uncovered area is then etched using the second pattern as etching mask. After etching of the first pattern, a lithium-based layer is formed on the second pattern, the lithium-based layer and the second pattern forming a second lithium-based electrode.

11 Claims, 4 Drawing Sheets

(51) Int. Cl.
*H01M 6/18* (2006.01)
*H01M 6/40* (2006.01)
*H01M 10/052* (2010.01)
*H01M 10/0562* (2010.01)
*H01M 10/0585* (2010.01)
*H01M 10/38* (2006.01)
*B81C 1/00* (2006.01)
*G03F 7/09* (2006.01)
*C09K 13/04* (2006.01)
*C23F 1/02* (2006.01)
*C23F 4/00* (2006.01)

(56) References Cited

U.S. PATENT DOCUMENTS

| | | | | |
|---|---|---|---|---|
| 2010/0068617 | A1* | 3/2010 | Bedjaoui | H01M 2/0275 429/163 |
| 2011/0311883 | A1 | 12/2011 | Oukassi et al. | |
| 2012/0321938 | A1* | 12/2012 | Oukassi | H01M 2/204 429/162 |
| 2013/0230646 | A1* | 9/2013 | Wallace | H01M 6/40 427/126.1 |
| 2015/0084157 | A1* | 3/2015 | Tegen | H01L 21/822 257/528 |

* cited by examiner

LITHIUM MICROBATTERY FABRICATION METHOD

BACKGROUND OF THE INVENTION

The invention relates to patterning of a layer of solid electrolyte, in particular to produce a lithium microbattery.

STATE OF THE ART

A lithium microbattery is an electrochemical accumulator implementing $Li^+$ ions and comprising an active stack of thin layers. The active stack is formed by two electrodes, one positive and the other negative, separated by a solid electrolyte.

The solid electrolyte is an electric insulator having a high ionic conductivity. The solid electrolyte generally has a base formed by a lithiated component. Furthermore, the positive electrode is a lithium insertion material, for example a lithiated metal oxide.

Lithium microbatteries called "lithium-metal" microbatteries comprise a negative electrode made from metallic lithium. Furthermore, lithium microbatteries called "lithium-ion" microbatteries comprise a negative electrode formed by a lithium insertion or intercalation material.

Lithium microbatteries are particularly advantageous due to their high mass density and their low toxicity. However, a lithium microbattery is very sensitive to air and to moisture.

The lithium-base layers are in fact very reactive and very chemically unstable. The presence of lithium, and in certain cases of sulphur, in thin layers forming a microbattery gives these layers a highly hygroscopic nature and a chemical instability in air. This type of thin layers, in particular the layers of solid electrolyte, are in fact difficult to pattern.

Particular attention therefore has to be paid to the different steps of producing and packaging a lithium microbattery.

To perform fabrication of a microbattery, a conventional technique consists in successively depositing the thin layers of the microbattery, in particular by vacuum deposition techniques.

Patterning of a layer of solid electrolyte is generally performed using shadow masking. The vacuum deposition, PVD (Physical Vapor Deposition) for example, can be performed through a shadow mask presenting recesses. The mask is placed on the substrate and held in position throughout the deposition. The shadow mask is then removed and the substrate presents the required patterns.

This masking technique generates particle contamination and shadow masking can also scratch the layer on which it is placed, thereby being liable to damage the microbattery considerably. Furthermore, when the size of the microbattery is small, shadow masking can generate edge or shadow effects which prove detrimental for satisfactory operation of the microbattery.

International Patent application WO2012173874 furthermore discloses a method for producing lithium microbatteries using a patterning technique of a layer of electrolyte made from lithium and phosphorus oxynitride (LiPON) by laser ablation. The thin layers forming the electrodes and the current collectors are formed in conventional manner using deposition through a shadow mask. Furthermore, the solid electrolyte is deposited without the use of a shadow mask, and patterning of the latter is performed using a pulsed laser beam having a size of 1 mm². The laser beam has to scan the whole useful surface of the substrate on which the microbatteries are made.

This technique furthermore depends greatly on the substrate used and on the nature of the layer is deposited at lower levels. This method can further require the use of different devices, which increases the risk of exposure of the solid electrolyte layer to air and moisture. Implementation of this fabrication method is therefore slow and complex.

OBJECT OF THE INVENTION

The object of the invention is to provide a method for fabricating a lithium microbattery that is easy to perform, inexpensive and compatible with the technologies implemented in the microelectronics field.

This object tends to be achieved by providing a method for fabricating a lithium microbattery comprising the following successive steps:
  providing a stack of layers successively comprising:
    a first layer made from a first material;
    a second layer made from a second material configured to combine with the lithium atoms;
    a solid electrolyte layer;
    a first electrode;
  etching of the first and second materials to form a first pattern made from the first material and a second pattern made from the second material, the second pattern defining a covered area and an uncovered area of the electrolyte layer;
  etching of the uncovered area of the electrolyte layer using the second pattern as etching mask, and eliminating the first pattern;
  forming a lithium-based layer on the second pattern, the second material being configured such that the lithium atoms diffuse into the second pattern, the lithium-based layer and the second pattern forming a lithium-based second electrode.

In advantageous manner, formation of the first and second patterns comprises the following steps:
  etching of the first material so as to define the first pattern made from the first material arranged on the second layer;
  etching of the second material to form the second pattern using the first pattern as etching mask.

Furthermore, etching of the uncovered area of the electrolyte layer and etching of the first pattern are advantageously performed simultaneously.

Advantageously, etching of the second material is performed by plasma etching using the electrolyte layer as etch stop layer.

Furthermore, according to other advantageous and non-restrictive features:
  the lithium-based layer and the first material of the first pattern undergo heat treatment configured to make the lithium atoms diffuse into the second pattern;
  the second electrode comprises a lithium atom concentration of at least 90%;
  the electrolyte layer is formed by a material chosen from LiPON, LiSiPON, Thio-LiSiCON or LiBON;
  the second layer is formed by a material chosen from Si, Ge, Sn, C, Au or Pt;
  the first layer formed by a material chosen from Al, $Al_2O_3$, Ti, Ni, Cr, or LiPON;
  the first pattern is formed by deposition of a photoresist layer on the first layer followed by a photolithography step and an etching step of the first material.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
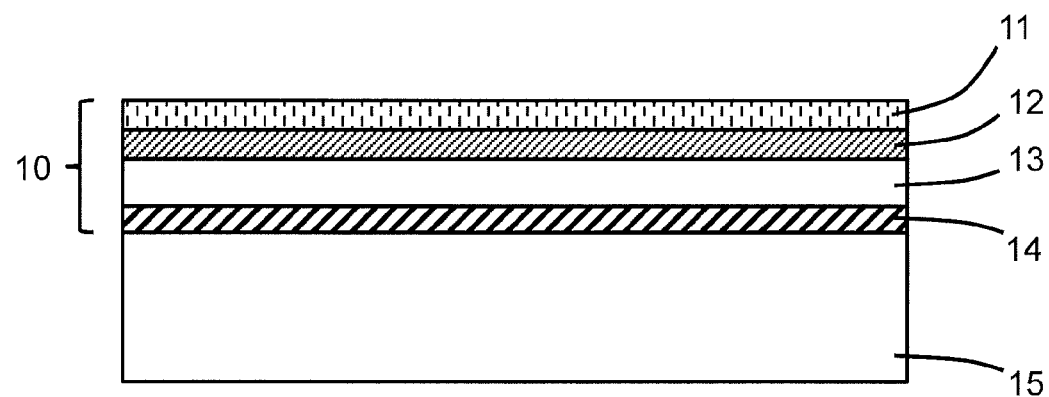
FIGS. 1 to 5 represent fabrication steps of a microbattery according to an embodiment, in schematic manner, in cross-sectional view.

According to a first embodiment illustrated in FIGS. 1 to 5, the method comprises provision of a stack 10 successively comprising a first layer 11 made from first material, a second layer 12 made from second material, a solid electrolyte layer 13 and a first electrode 14. In particular, thin layers 12 to 14 are designed to form a lithium microbattery.

Thin layers 11 to 14 can be deposited successively on a substrate 15 by conventional microelectronics industry techniques, for example by Physical Vapor Deposition (PVD), vacuum evaporation deposition, or Chemical Vapor Deposition (CVD). The thickness of thin layers 11 to 14 can vary between a few nanometres and a few tens of micrometres.

Substrate 15 is generally a silicon wafer able to comprise an integrated circuit, the substrate can also be made from glass or ceramic. Substrate 15 can be covered by a passivation layer, typically formed by silicon oxide, or by a bilayer formed by a layer of oxide and a layer of silicon nitride. Substrate 15 can also form first electrode 14.

Furthermore, first electrode 14 is generally an electrode generating $Li^+$ ions or containing a lithium insertion material. The material used as active material of first electrode 14 can be a non-lithiated material such as a vanadium oxide ($V_xO_y$) or a titanium oxysulphide ($TiO_xS_y$). The material of electrode 14 can also be a lithiated material such as a lithium and cobalt oxide ($LiCoO_2$), or a lithium and nickel oxide ($LiNiO_2$), etc.

Substrate 15 can also comprise other thin layers, in particular layers forming current collectors of the microbattery. Conventionally, these current collectors are formed by metallic layers, for example made from platinum, chromium, gold, titanium, etc. The fabrication step of these current collectors is independent from the step of formation of stack 10. In other words, the current collectors of the microbattery can be produced before, during, or after the formation step of stack 10.

As illustrated in FIG. 1, solid electrolyte layer 13 is arranged on first electrode 14. Solid electrolyte 13 is a layer permeable to lithium ions, and it is preferably lithium-based. In other words, electrolyte 13 is configured so as to enable conduction of the lithium $Li^+$ ions. Preferably, the material of solid electrolyte 13 is an electrically insulating material. Solid electrolyte 13 can be made from lithium and boron oxynitride (LiBON), lithium and silicophosphate oxynitride (LiSiPON), etc. In preferential manner, solid electrolyte 13 is made from lithium and phosphorus oxynitride (LiPON) referred to as "lipon".

Stack 10 also comprises a bilayer arranged on solid electrolyte 13. The bilayer is formed by a first layer 11 made from first material arranged on a second layer 12 made from second material. The bilayer is designed to form an etching mask to in particular pattern solid electrolyte layer 13.

First layer 11 is a sacrificial layer and can be formed by aluminium (Al), alumina ($Al_2O_3$), titanium (Ti), nickel (Ni), chromium (Cr), etc.

Second layer 12 is preferentially made from a material configured to combine with the lithium atoms, or at least to have a diffusion of the lithium atoms in second layer 12. The second material can be formed by silicon (Si), germanium (Ge), tin (Sn), carbon (C), gold (Au), platinum (Pt), etc. Second layer 12 is configured to form a second electrode 16 of opposite polarity with respect to first electrode 14.

The thickness of layers 11 and 12 is comprised between a few nanometres and a few tens of nanometres, preferably between 5 and 100 nm.

Figure 2:
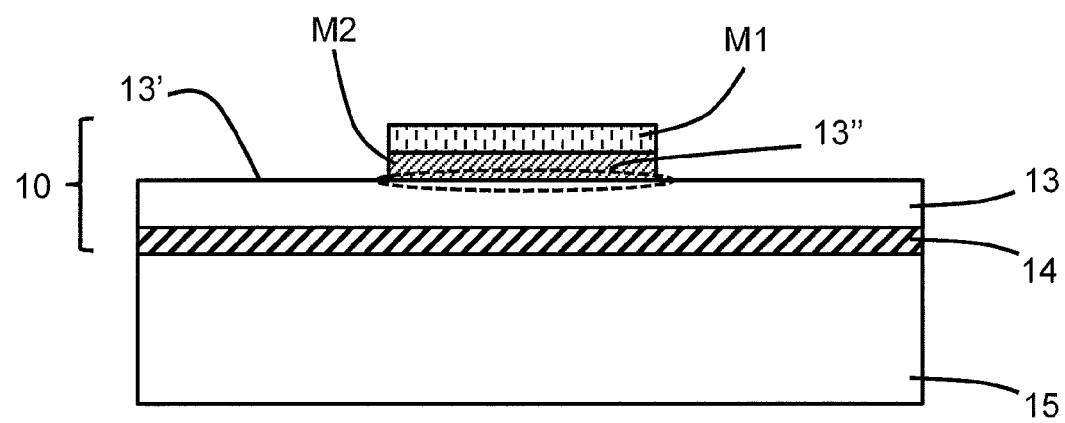
Figure 3:
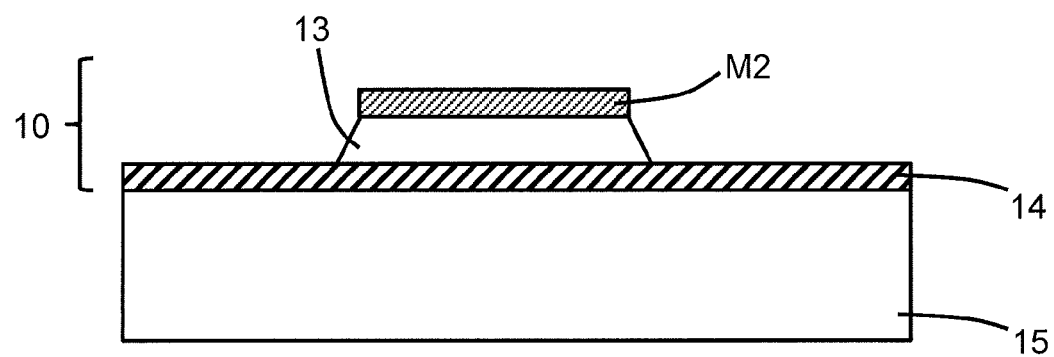

The method for fabricating a lithium microbattery also comprises a step of etching first and second materials to form first and second patterns M1 and M2, as illustrated in FIG. 2.

The first pattern M1 is made from the first material. The second pattern M2 is made from the second material and it is configured to define a covered area 13″ and an uncovered area 13′ of solid electrolyte layer 13. Second layer 12, in particular second pattern M2, advantageously protects electrolyte layer 13 and especially the interface between solid electrolyte 13 and the second material when the different steps for carrying out the microbattery are performed.

Etching of the first and second materials is performed by any known means, for example by conventional techniques used in the microelectronics field compatible with the first and second materials.

Figure 6:
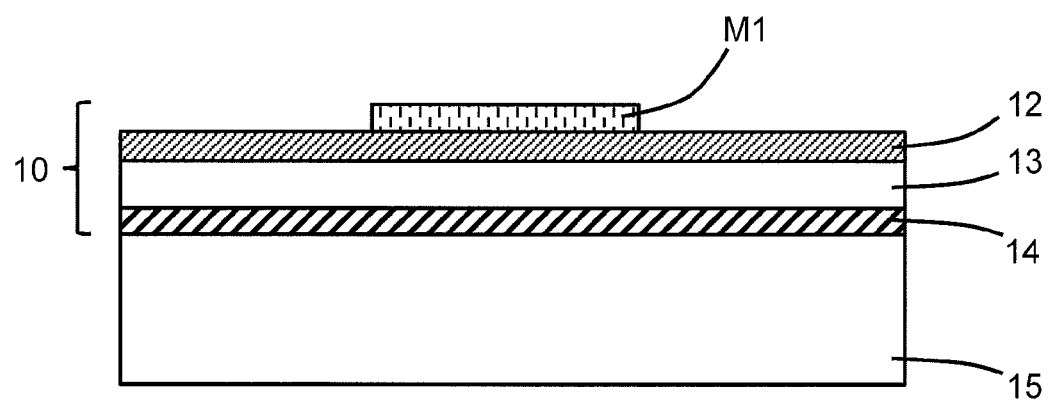
FIG. 6 represents a variant of a fabrication step of a microbattery according to an embodiment, in schematic manner, in cross-sectional view.

In advantageous manner, formation of first and second patterns M1 and M2 is achieved by etching of the first material in a first step to define first pattern M1 made from first material arranged on second layer 13. As illustrated in FIG. 6, first pattern M1 is formed whereas solid electrolyte 13 is protected by second layer 12. First pattern M1 is then used as etching mask to form second pattern 12 by etching of the second material.

Figure 7:
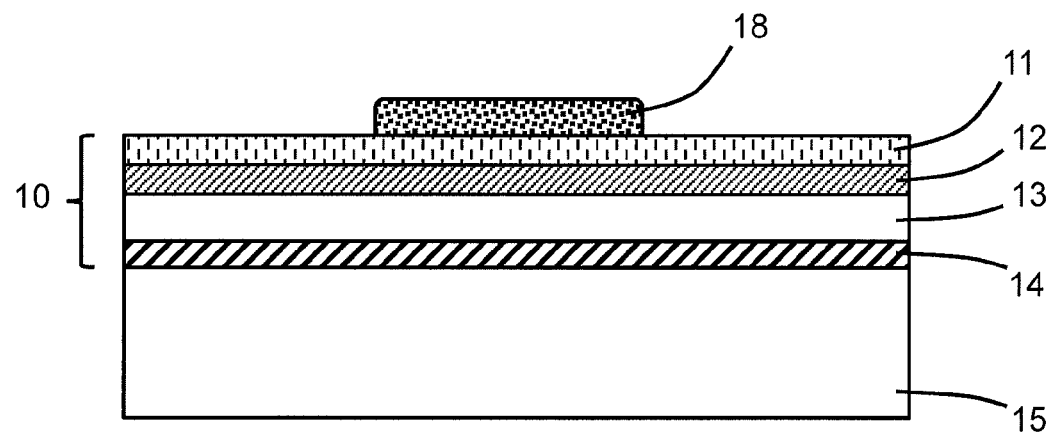
FIG. 7 represents a variant of another fabrication step of a microbattery according to an embodiment, in schematic manner, in cross-sectional view.

As illustrated in FIG. 7, first pattern M1 is advantageously formed by deposition of a photoresist layer 18 on first layer 11 followed by a photolithography step and an etching step. The use of a photoresist and of an etching step is easy to perform, compatible with several materials to be etched, and enables patterns to be defined with very great precision.

According to an example embodiment, first layer 11 is made from aluminium and has a thickness of 20 nm. Second layer 12 is made from silicon and has a thickness of 10 nm. According to this embodiment, pattern M1 is achieved by depositing a photoresist layer 18, for example of S1818 type manufactured by Shipley. A photolithography step is then performed as illustrated in FIG. 7. In other words, photoresist layer 18 is exposed and then developed so as to define a pattern performing protection of a portion of first layer 11. The areas of first layer 11 made from aluminium which are not protected by photoresist protection pattern 18 are selectively eliminated with respect to second material 12, i.e. the silicon. This elimination can be performed by wet etching in an "AL ETCH" commercial solution comprising a mixture of phosphoric acid, nitric acid and acetic acid at ambient temperature. After etching of layer 11, the photoresist is removed by means of an acetone jet.

The second material is furthermore advantageously etched by plasma to form second pattern M2. The second material is etched advantageously using solid electrolyte layer 13 as etch stop layer.

According to the example embodiment, etching of second layer 12 made from silicon is performed by reactive ion etching with an ICP plasma (ICP standing for Inductively Coupled Plasma) comprising $SF_6$ and argon gases. Etching was performed in an RIE (Reactive Ion Etching) reactor under the following conditions: pressure of 5 mTorr, source power of 200 W, self-bias voltage of 100 V, temperature of 20° C., $SF_6$ flowrate of 20 sccm and argon flowrate of 10 sccm for 100 s. Etch stop is performed for example by detecting the electrolyte layer by luminescence of the plasma.

The use of plasma etching of the second layer advantageously prevents the solid electrolyte layer from being in contact with an aqueous solution. Deterioration of the solid electrolyte is thus prevented or at least minimized. Although plasma etching can cause a slight deterioration of uncovered area 13' of the electrolyte layer, in particular as far as the roughness is concerned, this area 13' will subsequently be eliminated. Degradation of the roughness of this area 13' is therefore not redhibitory for producing an operational lithium microbattery, all the more so as the interface between electrolyte 13 and second layer 12 advantageously remains protected and is not impacted by the plasma bombardment.

After formation of second pattern M2, the latter is used as etching mask to etch uncovered area 13' of electrolyte layer 13. First pattern M1 is moreover also etched.

In advantageous manner, first pattern M1 and uncovered area 13' are etched simultaneously. In even more advantageous manner, the materials of first layer 11 and of electrolyte 13 are chosen to be etched simultaneously by one and the same technique.

According to the example embodiment, first layer 11 is made from aluminium and the electrolyte layer is made from lipon, and etching of the two materials can advantageously be performed using a single aqueous solution, for example having a base formed by $H_3PO_4$.

The thickness of first layer 11 is further fixed so as to be smaller than a maximum thickness which depends on the etching rate of the first material by the etching solution and the time required to etch uncovered area 13' of electrolyte layer 13. Said maximum thickness is substantially equal to the time required to etch uncovered area 13', multiplied by the etching rate of the first material. In other words, the thickness of the first layer is chosen such that the etching time of the latter is shorter than the etching time of uncovered area 13' of the electrolyte layer.

According to the example embodiment, electrolyte layer 13 has a thickness of about 1.5 µm. An acid solution with a base formed by $H_3PO_4$ obtained by mixing 2 volumes of water and 1 volume of $H_3PO_4$ can be used to simultaneously etch the lipon and the aluminium of first pattern M1. First layer 11 of aluminium is thus configured to have a thickness of less than 20 nm.

The method for fabricating the microbattery further comprises a formation step of a lithium-based layer 16 on second pattern M2, after etching of uncovered area 13' and of first pattern M1. The second material is configured so that the lithium atoms diffuse in second pattern M2, lithium-based layer 16 and second pattern M2 thus forming a lithium-based second electrode 17.

Layer 16 is preferably a lithium layer. Layer 16 can also be formed by a lithium alloy. Furthermore, lithium-based layer 16 can be produced by any known method compatible with the materials of the different layers of the microbattery, in particular second layer 12. For example, layer 16 can be produced by thermal evaporation, by sputtering, or by electrodeposition.

Figure 4:
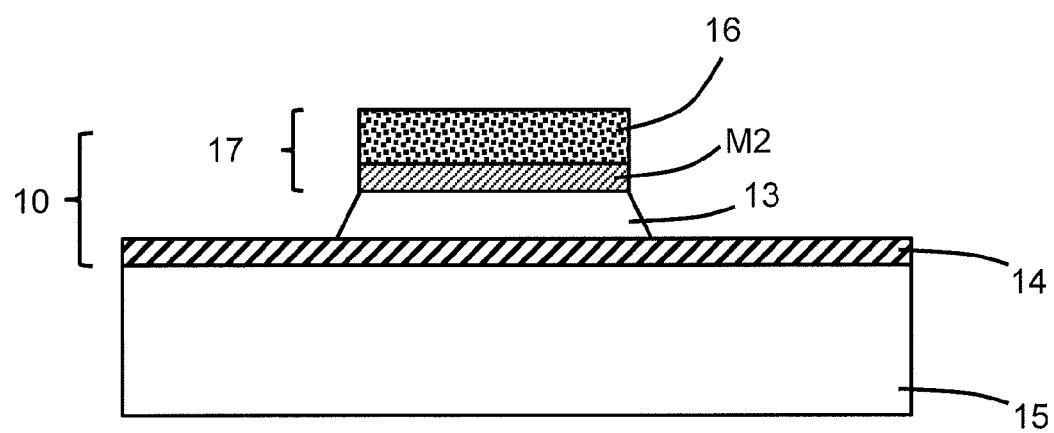
Figure 5:
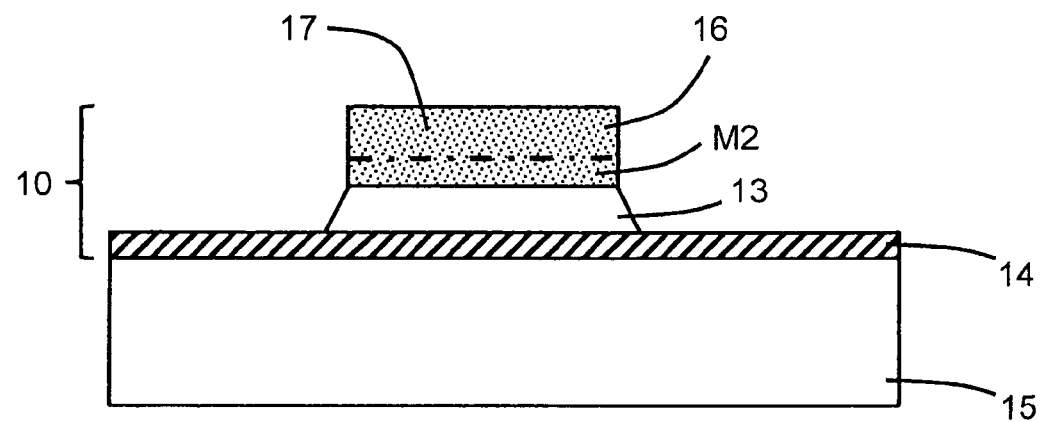

As illustrated in FIG. 4, the layer 16 containing lithium is preferably deposited in a localized manner on the second pattern M2. What is meant by localized deposition is a deposition only on the second pattern M2. Thus, we can overcome advantageously use a patterning step, in particular an etching step for forming a structured pattern 17. Indeed, given lithium-rich layer has a very strong chemical instability, it is technically very difficult if not impossible, to etch such a lithium-rich layer to obtain a structured pattern, as described above.

Lithium-based layer 16 is advantageously configured to react with the second material of pattern M2 so as to form second electrode 17 made from a lithium-rich alloy. What is meant by lithium-rich alloy is an alloy comprising at least 90% of lithium atoms.

Thus, the fabrication method according to the invention advantageously allows to avoid an etching step of the lithium-rich layer 16 and to avoid degradation of that layer by performing all patterning steps before the deposition of the layer 16.

The deposition technique of lithium-based layer 16 on second pattern M2 is configured in such a way as to make the lithium atoms diffuse into the second material of the second pattern. For example, the deposition technique can generate a temperature increase enabling diffusion of the lithium atoms into second pattern M2 so as to form a lithium-rich alloy. Heat treatment can in particular be performed on the substrate when deposition of layer 16 is performed by controlling the temperature of the substrate support. In general manner, it is the diffusion mechanisms which govern formation of a lithium-second material alloy.

In advantageous manner, heat treatment is applied during and/or after deposition of lithium-based layer 16 to accelerate and enhance the reaction of the material of layer 16 with the second material of pattern M2. In other words, layer 16 and pattern M2 undergo heat treatment configured to make the lithium atoms of layer 16 diffuse into first pattern M2.

Furthermore, the thickness of second layer 12 is small compared with the thickness of lithium-based layer 16. The thickness of layer 12 is in fact chosen such as to enable formation of a lithium-second material alloy which is rich in lithium.

According to the example embodiment, second layer 12 is made from silicon and has a thickness comprised between 50 and 100 nm. Under these conditions, layer 16 is made from lithium and its thickness is chosen greater than 1 µm.

The method described above enables a solid electrolyte layer to be patterned to form a microbattery.

Furthermore, the presence of lithium gives this type of layer a hygroscopic nature and an instability in air, which makes patterning of the latter difficult to perform.

When patterning of this type of layer is performed, it is advantageous to prevent or at least to minimize these steps in which the layer is in contact with the photoresist or with aqueous solutions, for example development or removal solutions. The contact of a solid electrolyte, for example made from lipon, with this type of products can in fact modify the chemical composition of the electrolyte by oxidation and/or hydration of the lithium, and it can also modify the morphology of the electrolyte layer caused by a volume expansion and/or a loss of cohesion.

In a lithium microbattery, transfer of the lithium ions ($Li^+$) takes place at the level of the interface between the electrolyte and the negative electrode. The quality of this interface is therefore very critical. A chemical reactivity at this interface, which can occur when patterning of the electrolyte layer is performed, can cause formation of an oxide or other phase between the electrolyte and the negative electrode layer arranged above the latter. This phase interposed between these two active layers of the microbattery can prevent if not slow down diffusion of the lithium ions thereby generating a strong charge transfer resistance in the microbattery and a deterioration of the expected electrochemical properties.

The method for performing fabrication of a microbattery according to the invention comprises an arrangement of first and second layers on the solid electrolyte before patterning is performed. The second layer is advantageously in contact with the solid electrolyte layer and protects the latter. The second layer is also designed to form the lithium-based negative electrode. This astute arrangement thus advantageously enables the solid electrolyte to be patterned while at the same time preserving the electrolyte/negative electrode interface throughout the microbattery fabrication method.

Advantageously, the second layer arranged on the solid electrolyte prevents any contact of the solid electrolyte, in particular the electrolyte/negative electrode interface, with a photoresist resin. Furthermore, the fabrication method minimizes the contact of the electrolyte layer with aqueous solutions.

Furthermore, the first layer arranged on the second layer also preserves the interface of the second layer on which a lithium-based layer is deposited to form said negative electrode of the microbattery.

The fabrication method according to the invention further avoids the use of mechanical masks, which advantageously enables shadowing and particle contamination effects to be prevented. The method thereby enables the integration density of lithium microbatteries made on a single substrate to be increased, and makes it possible to obtain patterns having a precise alignment while at the same time preserving the quality of the solid electrode. Deposition of an electrolyte layer through a mechanical mask does not in fact enable patterns of micrometric or nanometric size to be achieved like the conventional lithography etching techniques used in the microelectronics field. Furthermore, deposition through a mask further generates shadowing effects negatively impacting the compactness of the fabricated microbatteries and their electrochemical properties.

The method described in the foregoing further enables patterning of several patterns of the solid electrolyte simultaneously, which reduces the production time of the lithium microbattery fabrication method, unlike a patterning technique of the solid electrolyte by laser ablation.

The use of the first and second layers as etching masks facilitates fabrication of the microbattery while using conventional techniques of the micro-electronics field. It is thereby easier to incorporate or integrate a lithium microbattery on a microcomponent or on a substrate comprising other microelectronic devices or microsystems.

The invention claimed is:

1. A fabrication method of a lithium microbattery, comprising the following successive steps:
   providing a stack of layers successively comprising:
      a first layer made from a first material;
      a second layer made from a second material configured to combine with lithium atoms;
      a solid electrolyte layer;
      a first electrode;
   etching the first and second materials to form a first pattern made from the first material and a second pattern made from the second material, the second pattern defining an uncovered area and a covered area of the electrolyte layer;
   etching the uncovered area of the electrolyte layer using the second pattern as etching mask, and eliminating the first pattern;
   depositing in localized manner a lithium-based layer on the second pattern, the second material being configured such that the lithium atoms diffuse into the second pattern, the lithium-based layer and the second pattern forming a lithium-based second electrode.

2. The method according to claim 1, wherein the formation of the first and second patterns comprises the following steps:
   etching the first material so as to define the first pattern made from the first material arranged on the second layer;
   etching the second material to form the second pattern using the first pattern as etching mask.

3. The method according to claim 1, wherein the etching of the uncovered area of the electrolyte layer and etching of the first pattern are performed simultaneously.

4. The method according to claim 1, wherein formation of the second pattern is achieved by plasma etching of the second material using the electrolyte layer as etch stop layer.

5. The method according to claim 1, wherein the lithium-based layer and the second material of the second pattern undergo heat treatment configured to make the lithium atoms diffuse into the second pattern.

6. The method according to claim 1, wherein the second electrode comprises a lithium atom concentration of at least 90%.

7. The method according to claim 1, wherein the electrolyte layer is formed by a material selected from the group consisting of LiPON, LiSiPON, Thio-LiSiCON, and LiBON.

8. The method according to claim 1, wherein the second layer is formed by a material selected from the group consisting of Si, Ge, Sn, C, Au, and Pt.

9. The method according to claim 1, wherein the first layer is formed by a material selected from the group consisting of Al, $Al_2O_3$, Ti, Ni, Cr, and LiPON.

10. The method according to claim 1, wherein the first pattern is formed by deposition of a photoresist layer on the first layer followed by a photolithography step and an etching step of the first material.

11. A fabrication method of a lithium microbattery, comprising the following successive steps:
   providing a stack of layers successively comprising:
      a first layer made from a first material;
      a second layer made from a second material configured to combine with lithium atoms;
      a solid electrolyte layer;
      a first electrode;
   etching the first and second materials to form a first pattern made from the first material and a second pattern made from the second material, the second pattern defining an uncovered area and a covered area of the electrolyte layer;
   etching the uncovered area of the electrolyte layer using the second pattern as etching mask, and eliminating the first pattern;
   depositing in localized manner a lithium-based layer directly on an uncovered area of the second pattern, the second material being configured such that the lithium atoms diffuse into the second pattern, the lithium-based layer and the second pattern forming a lithium-based second electrode.

* * * * *